(12) United States Patent
Pitts

(10) Patent No.: US 7,784,015 B2
(45) Date of Patent: Aug. 24, 2010

(54) METHOD FOR GENERATING A MASK LAYOUT AND CONSTRUCTING AN INTEGRATED CIRCUIT

(75) Inventor: Robert L. Pitts, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 912 days.

(21) Appl. No.: 11/175,775

(22) Filed: Jul. 5, 2005

(65) Prior Publication Data

US 2007/0011639 A1    Jan. 11, 2007

(51) Int. Cl.
*G06F 17/50* (2006.01)
*G03F 1/00* (2006.01)

(52) U.S. Cl. .................. 716/19; 716/1; 716/4; 716/5; 716/11; 716/14; 716/21; 430/5

(58) Field of Classification Search .............. 716/4, 716/11, 12, 14, 19, 21; 700/121; 430/5
See application file for complete search history.

(56) References Cited

U.S. PATENT DOCUMENTS

| | | | |
|---|---|---|---|
| 5,700,601 A * | 12/1997 | Hasegawa et al. | 430/5 |
| 5,754,826 A * | 5/1998 | Gamal et al. | 703/14 |
| 6,067,409 A | 5/2000 | Scepanovic et al. | |
| 6,269,280 B1 * | 7/2001 | Miyanishi et al. | 700/121 |
| 6,304,998 B1 * | 10/2001 | Kamiya et al. | 716/4 |
| 6,324,673 B1 * | 11/2001 | Luo et al. | 716/11 |
| 6,374,395 B1 * | 4/2002 | Wang | 716/11 |
| 6,664,009 B2 * | 12/2003 | Liu | 430/5 |
| 6,706,452 B2 * | 3/2004 | Hayano et al. | 430/5 |
| 6,733,929 B2 * | 5/2004 | Pierrat | 430/5 |
| 6,961,920 B2 * | 11/2005 | Zach | 716/21 |
| 7,135,344 B2 * | 11/2006 | Nehmadi et al. | 438/14 |
| 7,174,520 B2 * | 2/2007 | White et al. | 716/4 |
| 7,197,723 B2 * | 3/2007 | Braun et al. | 716/3 |
| 7,243,316 B2 * | 7/2007 | White et al. | 716/4 |
| 7,247,553 B2 * | 7/2007 | Ohayashi et al. | 438/622 |
| 7,378,195 B2 * | 5/2008 | Graur et al. | 430/5 |
| 2002/0069396 A1 | 6/2002 | Bhattacharya et al. | |
| 2004/0230933 A1 * | 11/2004 | Weaver et al. | 716/12 |
| 2005/0010890 A1 * | 1/2005 | Nehmadi et al. | 716/19 |
| 2006/0085768 A1 * | 4/2006 | Heng et al. | 716/2 |
| 2006/0225017 A1 * | 10/2006 | Uchida | 716/12 |
| 2007/0157139 A1 * | 7/2007 | White et al. | 716/4 |
| 2007/0245290 A1 * | 10/2007 | Bueti et al. | 716/19 |
| 2008/0244483 A1 * | 10/2008 | Chang et al. | 716/5 |
| 2009/0267124 A1 * | 10/2009 | Bosshard | 257/296 |

FOREIGN PATENT DOCUMENTS

JP         2006126745 A  *  5/2006

* cited by examiner

*Primary Examiner*—Helen Rossoshek
(74) *Attorney, Agent, or Firm*—Dawn V. Stephens; Wade James Brady, III; Frederick J. Telecky, Jr.

(57) ABSTRACT

Methods are disclosed for the layout and manufacture of microelectronic circuits. The methods employ the monitoring of the placement of macros within circuit layouts for design rule compliance. Upon detection of noncompliance, the macros associated with noncompliance are adapted to bring the layout within the design rules. In a preferred embodiment of the invention monitoring the relative positions of macros includes identifying instances of coinciding macro (x, y) coordinates. Adapting noncompliant macros further includes steps for maintaining minimum (x, y) distances between adjacent macro corners.

6 Claims, 1 Drawing Sheet

METHOD FOR GENERATING A MASK LAYOUT AND CONSTRUCTING AN INTEGRATED CIRCUIT

TECHNICAL FIELD

The invention relates to semiconductor devices and their manufacture. More particularly, the invention relates to methodology for laying out microelectronic circuitry in compliance with selected design restrictions.

BACKGROUND OF THE INVENTION

Integrated circuit designers constantly strive to make the individual features within integrated circuits smaller so that the device density of the overall system can be improved. The ultimate size of devices in an integrated circuit is affected by the ability to create the photo mask used to implement the designed features, and by the ability to reproduce the masked features in the finished circuit. Typically, a standard cell library of macros for individual features is used to lay out the circuit. Various design rules are used to regulate the interactions among the macros. Problematically, standard cell library macros with high or low threshold voltage (Vt) transistors can be inefficient in their use of area. Also, the macros often have severe placement restrictions in an ASIC backplane. These inefficiencies are partly due to the design rules required to enable implant mask generation and subsequent use in a silicon fabrication process. The masks used for high Vt or low Vt implants have minimum width and space requirements. FIG. 1 (prior art) illustrates how these requirements may result in inefficient cell layout or placement. FIG. 1 shows a portion of an uncorrected layout indicated generally at 10. Features within the layout 10 that are not suitable for reproduction in a mask, such as the intersecting corners indicated at 12, create manufacturing difficulties. Design rules are used in order to avoid attempts to implement unmanufacturable layouts. A common approach taken in the arts in an effort to avoid this type of error is shown in FIG. 2 (prior art). The active area of the circuitry 14 used throughout the layout 11 is surrounded by an inactive area 16, avoiding the possibility of errors of a type (12) shown in FIG. 1. Although useful in preventing particular errors, this prior art approach leaves much to be desired in terms of efficient use of area.

Due to these and other problems, improved cell library macro layout methodology providing efficiencies in terms of design resources and area would be useful and advantageous in the arts. Accordingly, integrated circuit layout methods are provided that substantially eliminate or reduce some disadvantages associated with conventional methods.

SUMMARY OF THE INVENTION

In carrying out the principles of the present invention, in accordance with preferred embodiments thereof, semiconductor device layout and manufacturing methods provide dynamic monitoring and correction of the relative layout positions of standard cell library macros. A preferred embodiment of a layout method of the invention includes the step of monitoring the relative positions of macros for layout design rule compliance. Upon detection of layout design rule noncompliance, the affected macros are adapted to bring the layout into compliance.

According to one aspect of a preferred embodiment of the invention, steps include monitoring the relative positions of macros by identifying instances of coinciding macro (x, y) coordinates.

According to another aspect of the invention, steps for monitoring the layout include testing (x, y) macro coordinates against design rule parameters for predetermined (x, y) spacing of adjoining macro corners within the layout and adapting the noncompliant macros by adjusting (x, y) spacing of adjoining macro corners within the layout.

According to another aspect of the invention, a preferred embodiment of a method for constructing an integrated circuit includes the step of generating a layout having standard cell library macros for circuit features. The relative positions of the macros are monitored for design rule compliance. In the event of detection of noncompliance, the noncompliant macros are adapted to bring the layout into design rule compliance. The adapted layout is the basis for generating a mask with the desired features for a layer of the integrated circuit manufacturing according to the mask.

According to yet another aspect of the invention, methods for constructing an integrated circuit include steps for testing (x, y) macro coordinates against design rule parameters for predetermined (x, y) spacing of macro features within the layout and adapting the noncompliant macros.

The invention has advantages including but not limited to efficient layout and use of chip area and design resources without the need for additional design rules or architectural changes. These and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to like references in the various figures unless otherwise noted. Descriptive and directional terms used in the written description such as first, second, top, bottom, upper, side, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DETAILED DESCRIPTION OF PREFERRED EMBODIMENTS

Figure 1:
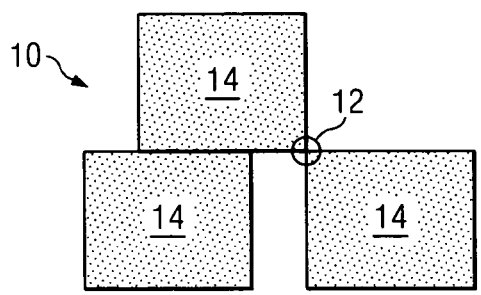
FIG. 1 (prior art) is a depiction of a layout error familiar in the arts in which standard cell library macros touch at corners.
Figure 2:
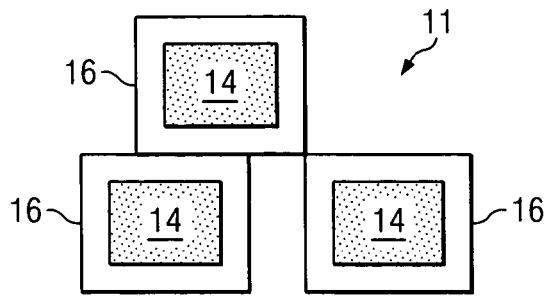
FIG. 2 (prior art) is an illustration representative of an example of an error-avoiding macro layout approach known in the arts.
Figure 3:
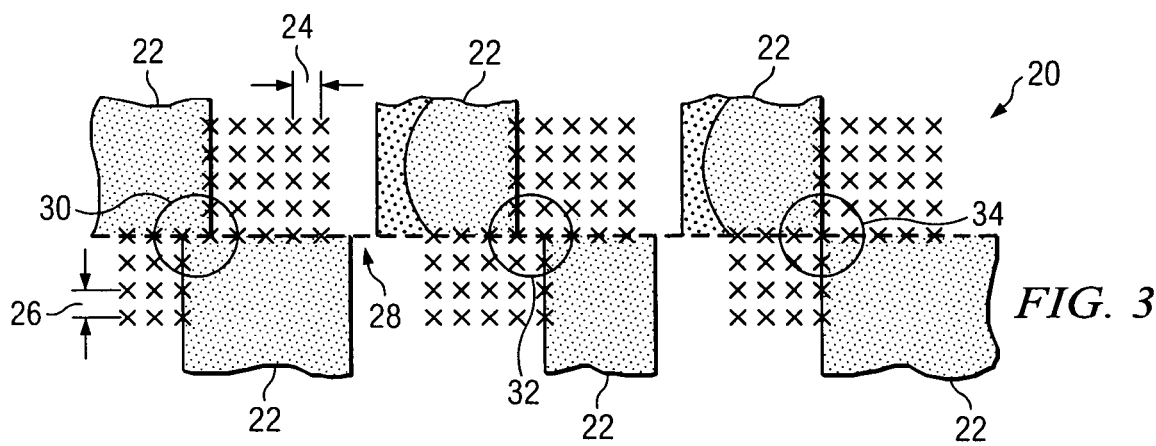
FIG. 3 introduces an example of the methodology of preferred embodiments of the invention.

FIG. 3 is a schematic diagram of a layout 20 useful for the purposes of describing the invention. The layout 20 includes macros 22 containing specific circuit elements, the details of which are not material to the practice of the invention. The macros 22 are arranged in a grid pattern with (x, y) coordinates having fixed dimensions, indicated by arrows 24, 26. Typically, the macros 22 are arranged in rows, in this example adjoining at line 28, subject to design rules. It will be appreciated by those reasonably skilled in the arts that the invention may be practiced with a wide range of dimensions and design rules and that the description herein is exemplary and not exclusive. As shown at location 30, macros 22 in adjacent rows may intersect in certain instances at row boundaries 28 so long as minimum (x, y) dimensions are maintained. At location 32, it is shown that separation of macros 22 at the boundary 28 of adjacent rows is also acceptable, again, so long as suitable (x, y) dimensions are maintained. As demonstrated at locale 34, however, it is possible for macros 22 in adjacent rows to meet in such a way that their (x, y) dimensions may be unacceptably small for resolution by the masking and manufacturing processes in use. Assuming for the sake of example that the arrangement shown at locale 34 violates a design rule for the particular application at hand, identification of such an occurrence is an early step in the implementation of the invention. It should be noted that the actual (x, y) dimensions may vary depending on the context in which the invention is employed, and that although the dimensions may vary from application to application, the methodology remains essentially unchanged.

Figure 4:
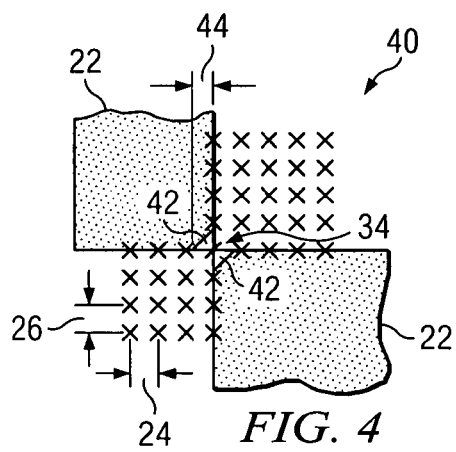
FIG. 4 is a further illustration of the example of the methodology of a preferred embodiment of the invention introduced with reference to FIG. 3.
Figure 5:
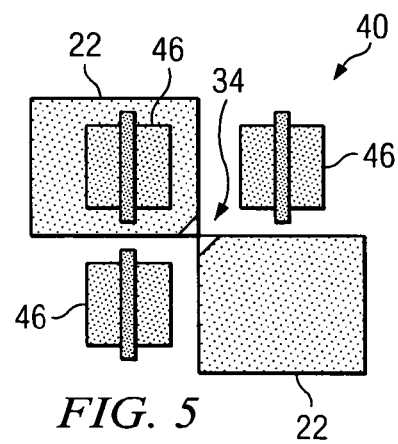
FIG. 5 is a close-up schematic drawing showing details of the exemplary embodiment of the invention shown in 4.

Now referring primarily to FIGS. 4 and 5, a layout 40 is shown demonstrating the use of the methods of invention to correct the design rule error at 34 introduced above. As can be seen in FIGS. 4 and 5, the adjoining corners 42 of each macro 22 contributing to the error are removed in order to provide (x, y) clearance 44 as specified by the particular design rule in use, the specifics of which are not essential to the practice of the invention. As shown in the more detailed view of FIG. 5, the active circuit areas 46 within the macros 22 are generally relatively remote from the corners, such that the removal of one or more corners from the macro 22 as shown has no effect on the electrical performance of the circuit.

Figure 6:
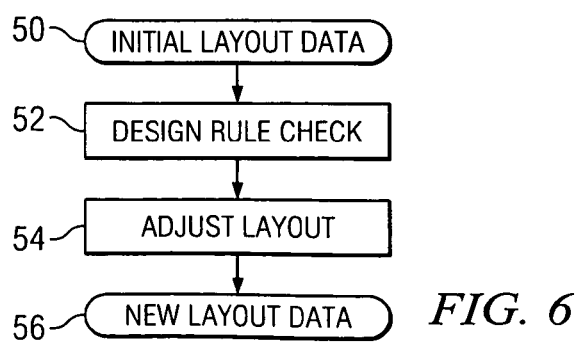
FIG. 6 is a process flow diagram illustrating a series of steps used in an example of a preferred embodiment of the invention.

FIG. 6 is a process flow diagram illustrating an example of the steps in the methodology of the present invention. The method begins at step 50 where the layout of a mask associated with an integrated circuit is initially determined as is common in the arts resulting in an initial layout defining the features of the circuit under manufacture. The method then proceeds to step 52 where design rule checking techniques are applied to the initial layout created in step 50. Appropriate corrections to the layout are made 54, as shown in order to conform the layout to design rules, resulting in a new layout 56 which may be implemented using established processes. It should be appreciated by those reasonably skilled in the arts that correction of individual errors as described does not affect the location of the macros, thus there is no necessity for shifting neighboring macros to accommodate changes to unrelated macros. Additional efficiencies maybe realized by achieving layout corrections in a single iteration of the method of the invention. Accordingly, the methods provided enable the efficient design rule testing, correction, and verification of mask layouts without the need for additional or amended design rules or architectural changes.

The methods of the invention provide advantages including but not limited to efficiencies in design layout throughput and chip area utilization. While the invention has been described with reference to certain illustrative embodiments, the methods described are not intended to be construed in a limiting sense. The spirit and scope of the present invention is defined by the appended claims. Various modifications and combinations of the illustrative embodiments as well as other advantages and embodiments of the invention will be apparent to persons skilled in the art upon reference to the description, drawings, and claims.

I claim:

1. A method for constructing an integrated circuit comprising the steps of:
    generating a mask layout for a desired set of features for a layer of the integrated circuit, the mask layout having standard cell library macros for one or more circuit features;
    disregarding relative positions of the macros for layout design rule compliance during the generating a mask layout;
    monitoring the relative positions of the macros for layout design rule compliance after disregarding the relative positions;
    upon detection of layout design rule noncompliance of the macros, generating an adapted mask layout by adapting the noncompliant macros for layout design rule compliance;
    generating a mask according to the adapted layout with the desired set of features for the layer of the integrated circuit; and
    manufacturing the integrated circuit layer according to the mask.

2. The method for constructing an integrated circuit according to claim 1 wherein monitoring the relative positions of macros further comprises the step of identifying instances of coinciding macro (x, y) coordinates.

3. The method for constructing an integrated circuit according to claim 1 wherein adapting noncompliant macros further comprises the step of removing instances of coinciding macro (x, y) coordinates.

4. The method for constructing an integrated circuit according to claim 3 wherein adapting noncompliant macros further comprises the step maintaining minimum (x, y) distances between adjacent macro corners.

5. The method for constructing an integrated circuit according to claim 1 wherein:
    the monitoring step further comprises the step of testing (x, y) macro coordinates against design rule parameters for predetermined (x, y) spacing of macro features within the layout; and
    adapting the noncompliant macros for layout design rule compliance further comprises the step of increasing (x, y) spacing of macro features within the layout.

6. The method for constructing an integrated circuit according to claim 1 wherein:
    the monitoring step further comprises the step of testing (x, y) macro coordinates against design rule parameters for predetermined (x, y) spacing of adjoining macro corners within the layout; and
    adapting the noncompliant macros for layout design rule compliance further comprises the step of increasing (x, y) spacing of adjoining macro corners within the layout.

* * * * *